(12) United States Patent
Cheng et al.

(10) Patent No.: US 7,139,060 B2
(45) Date of Patent: Nov. 21, 2006

(54) METHOD FOR MOUNTING A DRIVER IC CHIP AND A FPC BOARD/TCP/COF DEVICE USING A SINGLE ANISOTROPIC CONDUCTIVE FILM

(75) Inventors: Ping-Chin Cheng, Yingge Township, Taipei County (TW); Hui-Chang Chen, Kaohsiung (TW)

(73) Assignee: AU Optronics Corporation, Hsin-Chu (TW)

( * ) Notice: Subject to any disclaimer, the term of this patent is extended or adjusted under 35 U.S.C. 154(b) by 80 days.

(21) Appl. No.: 10/766,536

(22) Filed: Jan. 27, 2004

(65) Prior Publication Data

US 2005/0162603 A1    Jul. 28, 2005

(51) Int. Cl.
*G02F 1/1345* (2006.01)
(52) U.S. Cl. ...................... 349/150; 349/151
(58) Field of Classification Search ......... 349/149–152
See application file for complete search history.

(56) References Cited

U.S. PATENT DOCUMENTS 5,963,287 A    10/1999   Asada et al.
6,424,400 B1*  7/2002   Kawasaki ............... 349/149
6,556,268 B1*  4/2003   Lee et al. ................ 349/149
6,738,123 B1*  5/2004   Takahashi et al. ....... 349/152

FOREIGN PATENT DOCUMENTS

| CN | 1235375 A | 3/1999 |
| JP | 11064881 | 3/1999 |
| JP | 11-195866 | 7/1999 |
| JP | 2000183112 | 6/2000 |
| TW | 476122 | 2/2002 |

* cited by examiner

*Primary Examiner*—Toan Ton
(74) *Attorney, Agent, or Firm*—Duane Morris LLP

(57) ABSTRACT

A method for bonding integrated circuit chips and other devices to a liquid crystal display panel. The method involves using a single anisotropic conductive film that is sized to bond at least one integrated circuit chip and at least one other device, such as a flexible printed circuit board, a tape carrier package and a chip-on-film, to the liquid crystal display panel.

26 Claims, 6 Drawing Sheets

METHOD FOR MOUNTING A DRIVER IC CHIP AND A FPC BOARD/TCP/COF DEVICE USING A SINGLE ANISOTROPIC CONDUCTIVE FILM

FIELD OF THE INVENTION

This invention relates to liquid crystal display (LCD) panels and LCD devices and anisotropic conductive film bonding methods used in the manufacture of LCD panels and LCD devices.

BACKGROUND OF THE INVENTION

Flat panel display devices commonly use LCD panels. An LCD panel may include a pixel region having an array of pixel thin film transistors and intersecting arrays of spaced apart data lines and gate lines that are connected to the array of pixel thin film transistors. The array of pixel thin film transistors, data lines and gate lines form an array of addressable pixels. The LCD panel may also include a peripheral region having driver integrated circuit (IC) chips mounted therein, which drive the array of pixel thin film transistors. The peripheral region may also connect flexible printed circuit (FPC) boards, tape carrier packages (TCPs) and/or chip-on-film (COF) devices.

The driver IC chips may be mounted to the LCD panel in the peripheral region thereof using a chip-on-glass (COG) technology. In COG, anisotropic conductive films (ACFs) are used to bond the driver IC chips. ACFs are also used for connecting the FPC boards, TCPs, or COFs to the LCD panel.

The driver IC chips and the FPC board/TCP/COF devices are presently bonded to the panel in a multiple ACF bonding process or method. In the first step of the method, a first ACF adapted specifically for bonding the driver IC chip is applied to the LCD panel and then the IC chip is bonded to the panel, via the first ACF, using ACF bonding parameters specific to the IC chip. In the second step of the process, a second ACF adapted specifically for bonding the FPC board/TCP/COF device is applied to the LCD panel and then the FPC board/TCP/COF device is bonded to the panel, via the second ACF, using ACF bonding parameters specific to the FPC board/TCP/COF device.

The double ACF bonding method has a relatively high cost in terms of time, materials, and equipment. Further, the two different ACF types require separate classifications to ensure proper production line control.

SUMMARY OF THE INVENTION

A method is described herein for bonding integrated circuit chips and FPC board/TCP/COF devices to a liquid crystal display panel. In the method, an anisotropic conductive film is applied to a region of the liquid crystal display panel. The anisotropic conductive film is sized to bond at least one integrated circuit chip and at least one other device, such as a FPC board, a TCP, and a COF, to the panel.

Also described herein is a liquid crystal display device. The device comprises a thin film transistor array disposed on a first region of a panel. An anisotropic conductive film bonds at least one integrated circuit chip and at least one other device, such as a FPC board, a TCP, and a COF, to a second region of the panel.

Still further described herein is a method of manufacturing a liquid crystal display device. In this method, a thin film transistor array is formed on a first region of a liquid crystal display panel. After that, an anisotropic conductive film is applied to a second region of the panel. The anisotropic conductive film is sized to bond at least one integrated circuit chip and at least one other device, such as a FPC board, a TCP and a COF, to the panel.

DETAILED DESCRIPTION OF THE INVENTION

An anisotropic conductive film (ACF) bonding method is described herein for ACF bonding a driver integrated circuit (IC) chip and a flexible printed circuit (FPC) board, a tape carrier package (TCP), or a chip-on-film (COF) to a liquid-crystal-display (LCD) panel of a LCD device, using a single, unitary ACF. The bonding method simplifies the LCD panel and device manufacturing process, improves quantity of output and yield, and reduces M/C cost. For purposes of clarity only, the bonding method will be described below as it applies to a driver IC chip or chips and a FPC board. As mentioned above, the method is also applicable to the bonding of IC chip or chips and TCPs or COFs.

Figure 1A:
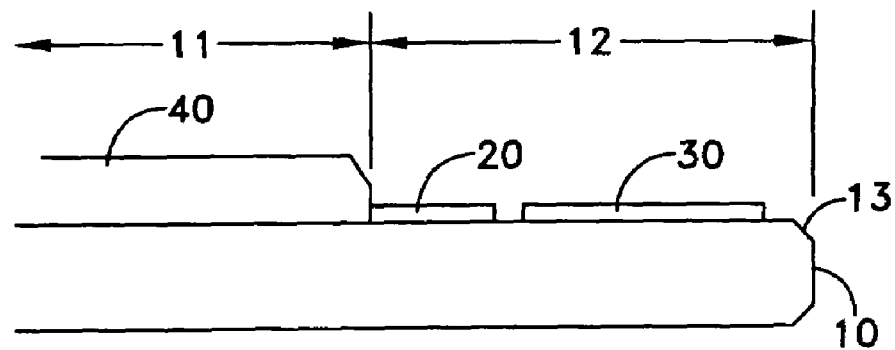
FIGS. 1A–1C are side elevational views of a section of a liquid crystal display panel illustrating an embodiment of the method of the invention.
Figure 2A:
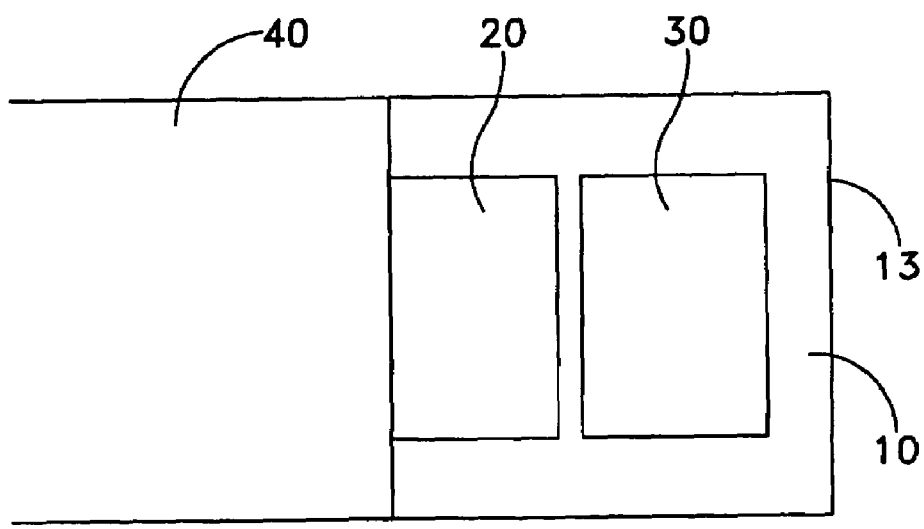
FIGS. 2A–2C are corresponding plan views of the liquid crystal display panel illustrated in respective FIGS. 1A–1C.

FIGS. 1A–1C and 2A–2C collectively illustrate an embodiment of the ACF bonding method. FIG. 1A illustrates an LCD panel 10 of a LCD device that will have a driver IC chip and a FPC board ACF bonded to a surface of the panel 10 using a single, unitary ACF. The panel 10 may be made from glass or quartz substrate and includes a pixel region 11 and a peripheral region 12. The pixel region 11 includes a pixel thin film transistor (TFT) array and electrically conductive gate and data lines connected to the TFT array. The design of the pixel TFT array and the gate and data lines is well known to persons of ordinary skill in the art and need not be described further herein. A color filter substrate 40 may also be provided over the pixel region 11. A first array 20 of electrically conductive electrodes, which terminate the gate or data lines that extend from the pixel region 11 to electrically connect the driver IC chip with the TFT array, is disposed on the surface of the LCD panel 10 in the peripheral region 12, remote from an edge 13 of the panel 10. A second array 30 of electrically conductive electrodes, for electrically connecting the FPC board with the driver IC chip, is disposed on the surface of the panel LCD 10, in the peripheral region 12 adjacent the edge 13 of the panel 10.

Figure 1B:
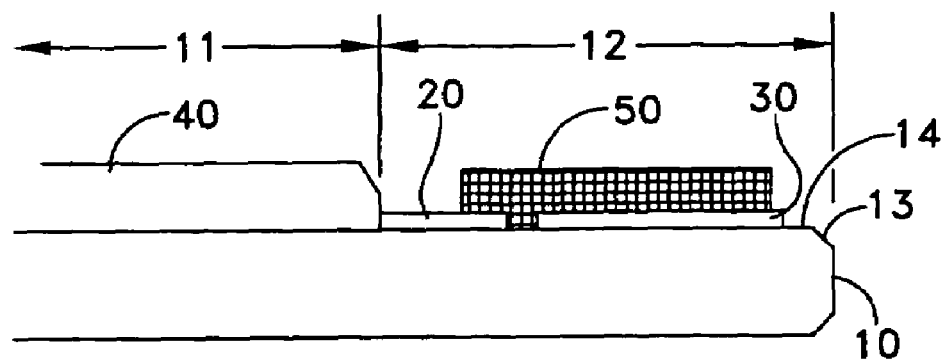
Figure 2B:
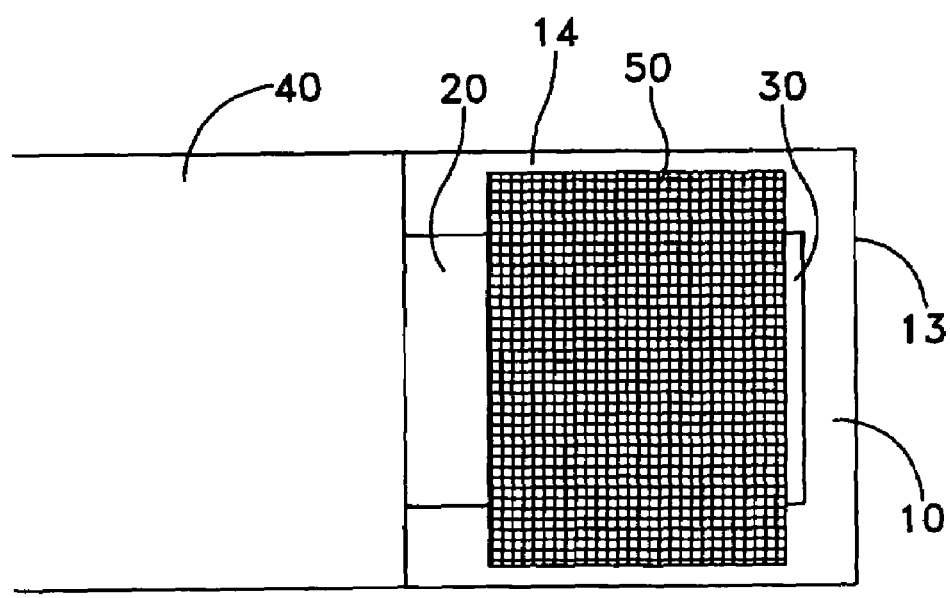

As illustrated in FIGS. 1B and 2B, a single, unitary ACF 50 is adhered to a surface 14 of the panel 10 in the peripheral region 12 thereof and positioned such that it covers connecting terminal portions of the electrode arrays 20 and 30.

The ACF 50 has a length and a width that are sufficient for covering the connecting terminal portions of both electrode arrays 20 and 30.

Figure 1C:
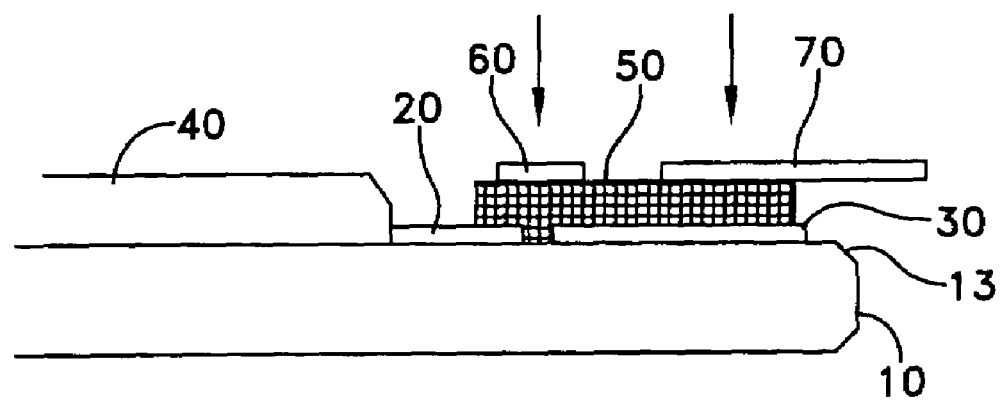
Figure 2C:
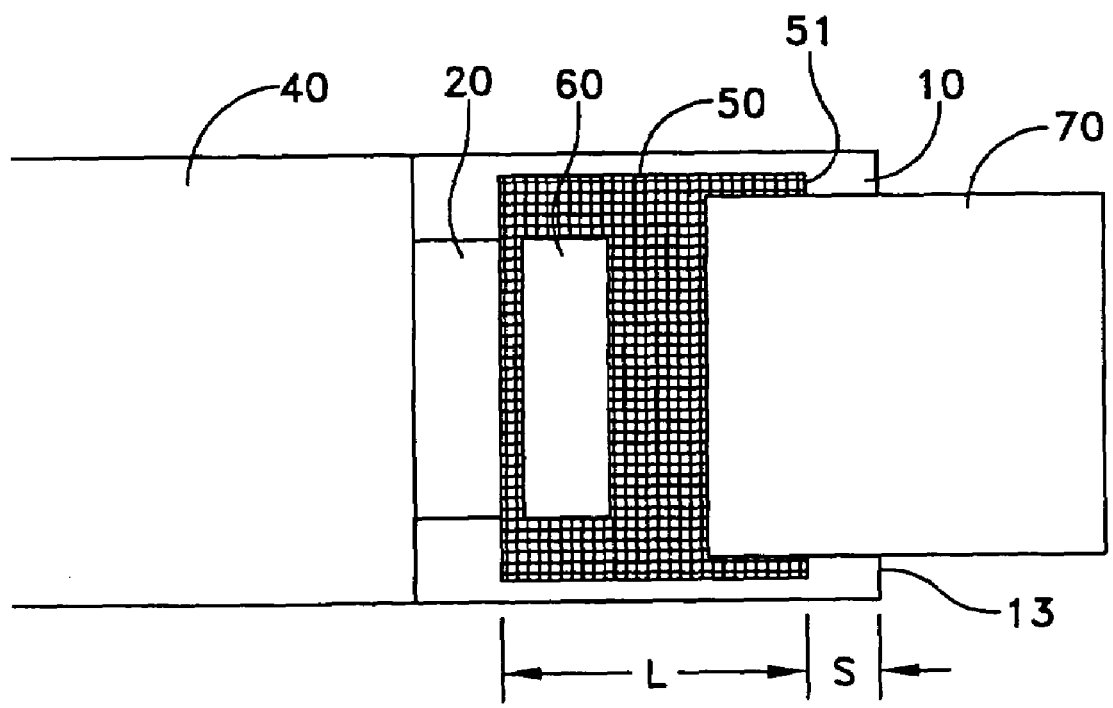

As illustrated in FIGS. 1C and 2C, a driver IC chip 60 and an end section of an FPC board 70 are placed on the ACF 50. The IC chip 60 may be positioned on the ACF 50 such that electrically conductive electrode bumps disposed on the bottom surface of the chip vertically align with corresponding terminal portions of both electrode arrays 20 and 30 on the surface 14 of the LCD panel 10, underneath the ACF 50. The driver IC chip 60 is then compressed with the LCD panel 10. The end section of the FPC board 70 is then positioned on the ACF 50 such that electrically conductive terminal leads disposed on the bottom surface of the FPC board vertically align with corresponding terminal portions of the electrode array 30 on the surface 14 of the LCD panel 10, underneath the ACF 50. The FPC board 70 is then compressed with the LCD panel 10. In an alternative embodiment, the FPC board 70 may be positioned on the ACF 50 first and compressed with the LCD panel 10, followed by the positioning of the IC chip 60 on the ACF 50 and the compressing of the IC chip 60 with the LCD panel 10. It is also contemplated that the IC chip 60 and the FPC board 70 may be compressed at the same time with the LCD panel 10 in a single compressing operation, after they have been placed on the ACF 50. In any case, the assembly is heated to approximately 120° C. to cure the ACF 50 so that the IC chip 60 and FPC board 70 adhere to the LCD panel 10. As is well known in the art, the ACF 50 comprises a plurality of conductive spheres dispersed in an adhesive resin. The adhesive resin in the ACF 50 adhesively bonds the driver IC chip 60 and the end section of the FPC board 70 to the LCD panel 10 and the conductive spheres in the ACF 50 electrically connects the electrode bumps of the IC chip 60 and the terminal leads of the FPC board with their respective terminal portions of electrode arrays 20 and 30. The conductive spheres of the ACF 50 that are located between the vertically aligned terminal portions of electrode arrays 20 and 30 and the bumps and terminal leads of the IC chip 60 and FPC board 70 are subjected to compressive forces during the compression. The compressive force ruptures a thin, electrically insulating membrane which covers each of the spheres, thus, allowing those spheres to electrically connect the vertically aligned terminal portions of the electrode arrays 20 and 30 and bumps and terminal leads of the IC chip 60 and FPC board 70. Adjacent vertically aligned IC chip bumps/FPC board leads and electrode array terminal portions remain electrically isolated from one another as the spheres located therebetween have not been compressed and remain electrically insulated from one another by their intact insulating membranes.

As illustrated in FIG. 2C, the ACF 50 may have a length L that allows far edge 51 of the ACF 50 to be spaced from the edge 13 of the LCD panel 10 by a distance S.

Figure 3A:
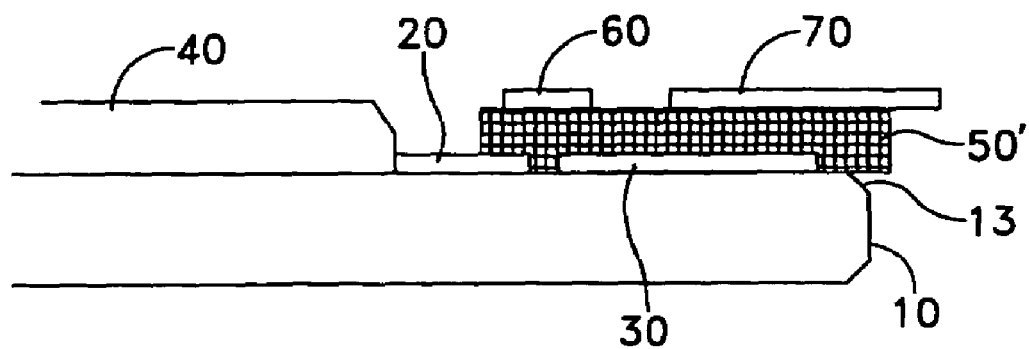
FIG. 3A is a side elevational view of a section of a liquid crystal display panel illustrating an alternate embodiment of the method of the invention.
Figure 3B:
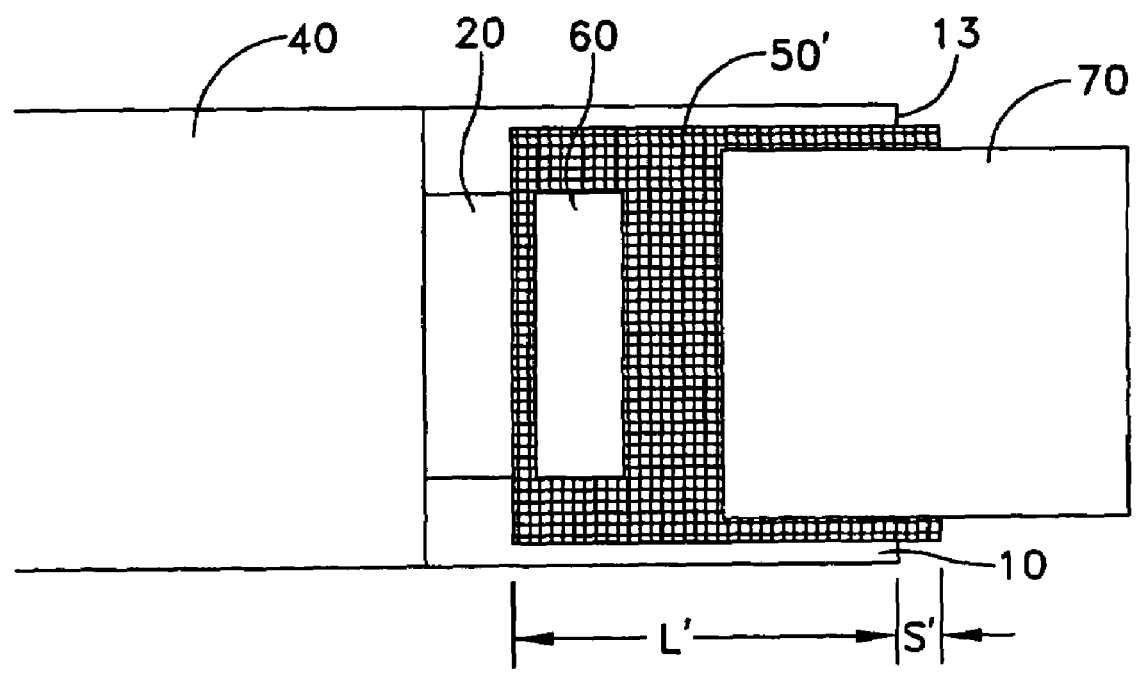
FIG. 3B is a corresponding plan view of the liquid crystal display panel illustrated in FIG. 3A.

In an alternate embodiment, as illustrated in FIGS. 3A and 3B, the ACF, denoted by numeral 50', may have a length L' that allows far edge 51' of the ACF 50' to extend over the edge 13 of the LCD panel 10 by a distance S' in order to improve the FPC peeling strength.

Figure 4:
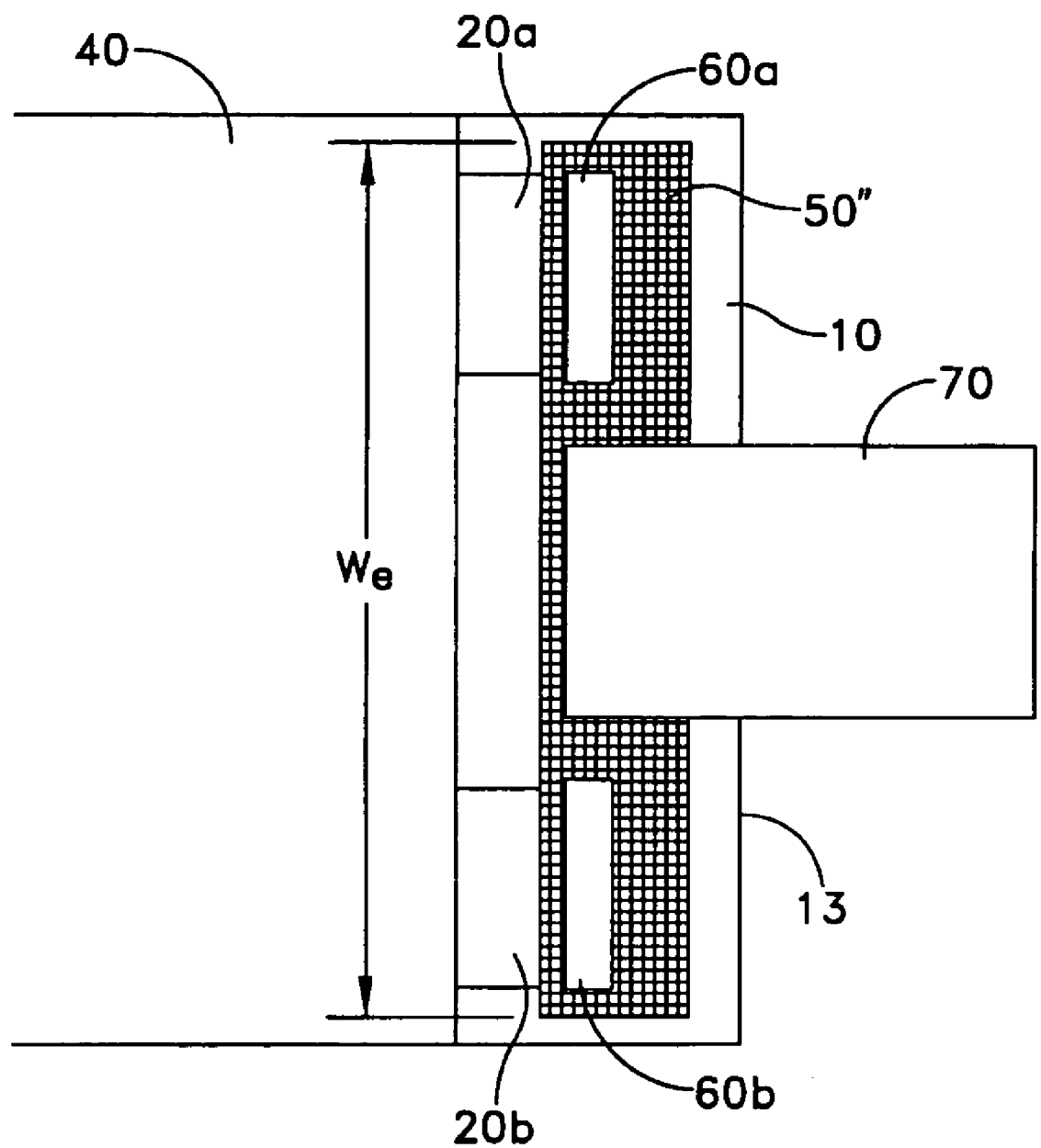
FIG. 4 is a plan view of a section of a liquid crystal display panel illustrating a further embodiment of the method of the invention.
Figure 5:
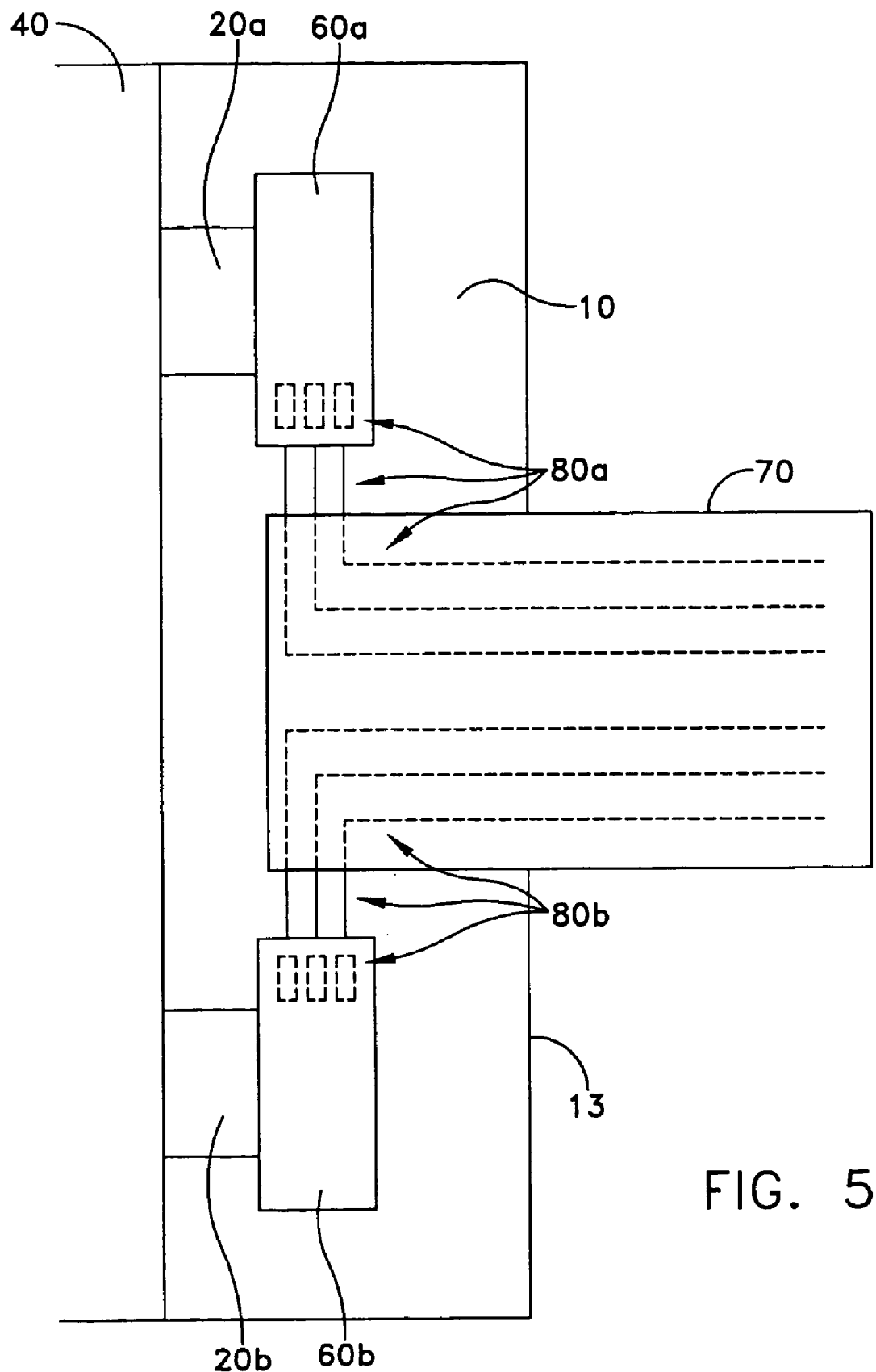
FIG. 5 is a plan view of the liquid crystal display panel of FIG. 4 shown without the ACF to illustrate IC-to-FPC electrode arrays.

In a further embodiment as illustrated in FIG. 4, the peripheral region 12 of the LCD panel 10 includes two arrays 20a and 20b of electrically conductive electrodes and two respective driver IC chips 20a and 20b. The ACF, denoted by numeral 50", may be configured to ACF bond both driver IC chips 20a and 20b and FPC board 70. This may be accomplished by providing the ACF 50" with an extended width $W_e$ that is sufficient for ACF bonding both IC chips 20a and 20b to electrode arrays 20a and 20b, and FPC board 70 to IC-to-FPC electrode arrays 80a and 80b, as shown in FIG. 5.

While the foregoing invention has been described with reference to the above, various modifications and changes can be made without departing from the spirit of the invention. Accordingly, all such modifications and changes are considered to be within the scope of the appended claims.

What is claimed is:

1. A method of bonding integrated circuit chips and other devices to a liquid crystal display panel, the method comprising the steps of:
    applying an anisotropic conductive film to a region of the liquid crystal display panel, the film sized to bond a first integrated circuit chip and an other device to the panel;
    placing one of the first integrated circuit chip and the other device on a first area portion of the film;
    compressing the one of the first integrated circuit chip and the other device together with the panel;
    placing the other one of the first integrated circuit chip and the other device on a second area portion of the film; and
    compressing the other one of the first integrated circuit chip and the other device together with the panel, wherein the first integrated circuit chip is electrically connected with the other device through the anisotropic conductive film extending continuously from the first integrated circuit chip to the other device.

2. The method according to claim 1, further comprising the step of curing the film.

3. The method according to claim 2, wherein the curing step includes heating the anisotropic conductive film to a predetermined temperature.

4. The method according to claim 1, wherein the other one of the first integrated circuit chip and the other device is compressed together with the panel at the same time the one of the first integrated chip and the other device is compressed with the panel.

5. The method according to claim 4, further comprising the step of curing the film.

6. The method according to claim 5, wherein the curing step includes heating the anisotropic conductive film to a predetermined temperature.

7. The method according to claim 1, wherein the region of the panel comprises a peripheral region.

8. The method according to claim 1, wherein the first integrated circuit chip comprises a first driver integrated circuit chip.

9. The method according to claim 1, wherein the anisotropic conductive film is spaced from an edge of the panel.

10. The method according to claim 1, wherein the anisotropic conductive film extends beyond an edge of the panel.

11. The method according to claim 1, wherein the anisotropic conductive film is sized to bond the first integrated circuit chip, a second integrated circuit chip and the other device to the panel, the second integrated chip is placed on the first area portion of the film, and the second integrated chip is compressed together with the panel.

12. The method according to claim 11, wherein the second integrated circuit chip is compressed together with the panel at the same time the first integrated circuit chip, and the other device are compressed with the panel.

13. The method according to claim 1, wherein the other device is selected from the group consisting of a flexible printed circuit board, a tape carrier package, and a chip-on-film.

14. A method of manufacturing a liquid crystal display device, the method comprising the steps of:

forming a thin film transistor array on a first region of a liquid crystal display panel;

applying an anisotropic conductive film to a second region of the panel, the film sized to bond a first integrated circuit chip and an other device to the second region of the panel;

placing one of the first integrated circuit chip and the other device on a first area portion of the film;

compressing the one of the first integrated circuit chip and the other device together with the panel;

placing the other one of the first integrated circuit chip and the other device on a second area portion of the film; and compressing the other one of the first integrated circuit chip and the other device together with the panel, wherein the first integrated circuit chip is electrically connected with the other device through the anisotropic conductive film extending continuously from the first integrated circuit chip to the other device.

15. The method according to claim 14, further comprising the step of curing the film.

16. The method according to claim 15, wherein the curing step includes heating the anisotropic conductive film to a predetermined temperature.

17. The method according to claim 14, wherein the other one of the first integrated circuit chip and the other device is compressed together with the panel at the same time the one of the first integrated chip and the other device is compressed with the panel.

18. The method according to claim 17, further comprising the step of curing the film.

19. The method according to claim 18, wherein the curing step includes heating the anisotropic conductive film to a predetermined temperature.

20. The method according to claim 17, wherein the first region of the panel comprises a pixel region and the second region of the panel comprises a peripheral region.

21. The method according to claim 14, wherein the first integrated circuit chip comprises a first driver integrated circuit chip.

22. The method according to claim 14, wherein the anisotropic conductive film is spaced from an edge of the panel.

23. The method according to claim 14, wherein the anisotropic conductive film extends beyond an edge of the panel.

24. The method according to claim 14, wherein the anisotropic conductive film is sized to bond the first integrated circuit chip, a second integrated circuit chip and the other device to the panel, the second integrated chip is placed on the first area portion of the film, and the second integrated chip is compressed together with the panel.

25. The method according to claim 24, wherein the second integrated circuit chip is compressed together with the panel at the same time the first integrated circuit chip, and the other device are compressed with the panel.

26. The method according to claim 14, wherein the other device is selected from the group consisting of a flexible printed circuit board, a tape carrier package, and a chip-on-film.

\* \* \* \* \*